(12) United States Patent
Nakatani et al.

(10) Patent No.: US 8,390,084 B2
(45) Date of Patent: Mar. 5, 2013

(54) MEMS SENSOR

(75) Inventors: Goro Nakatani, Kyoto (JP); Mizuho Okada, Kyoto (JP); Nobuhisa Yamashita, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/067,303

(22) Filed: May 23, 2011

(65) Prior Publication Data
US 2011/0227177 A1    Sep. 22, 2011

Related U.S. Application Data

(63) Continuation of application No. 12/485,696, filed on Jun. 16, 2009, now Pat. No. 8,039,911.

(30) Foreign Application Priority Data

Jun. 16, 2008 (JP) ................. 2008-156937

(51) Int. Cl.
H01L 29/84 (2006.01)

(52) U.S. Cl. . 257/415; 257/416; 257/420; 257/E21.002; 257/E21.704; 257/E29.324

(58) Field of Classification Search .................. 257/415, 257/416, 419, 420, E21.002, E21.704, E29.324; 381/174, 176; 438/53
See application file for complete search history.

(56) References Cited

U.S. PATENT DOCUMENTS

| | | | |
|---|---|---|---|
| 5,081,867 A | 1/1992 | Yamada | |
| 5,242,863 A | 9/1993 | Xiang-Zheng et al. | |
| 5,870,482 A | 2/1999 | Loeppert et al. | |
| 6,465,271 B1 | 10/2002 | Ko et al. | |
| 6,743,654 B2 | 6/2004 | Coffa et al. | |
| 6,892,579 B2 | 5/2005 | Ohtoyo et al. | |
| 6,930,367 B2 | 8/2005 | Lutz et al. | |
| 6,936,491 B2 | 8/2005 | Partridge et al. | |
| 7,023,066 B2 | 4/2006 | Lee et al. | |
| 7,074,637 B2 | 7/2006 | Lutz et al. | |
| 7,144,750 B2 | 12/2006 | Ouellet et al. | |
| 7,205,621 B2 | 4/2007 | Sato et al. | |
| 7,288,824 B2 | 10/2007 | Partridge et al. | |
| 7,329,933 B2 | 2/2008 | Zhe et al. | |
| 7,346,178 B2 | 3/2008 | Zhe et al. | |
| 7,381,663 B2 | 6/2008 | Sato et al. | |
| 7,537,953 B2 | 5/2009 | Tateishi et al. | |
| 7,781,249 B2 | 8/2010 | Laming et al. | |
| 7,803,665 B2 | 9/2010 | Witvrouw et al. | |
| 7,825,483 B2 | 11/2010 | Nakatani et al. | |

(Continued)

FOREIGN PATENT DOCUMENTS

| JP | 2-95264 | 4/1990 |
|---|---|---|
| JP | 9-304425 | 11/1997 |

(Continued)

*Primary Examiner* — Evan Pert
(74) *Attorney, Agent, or Firm* — Rabin & Berdo, P.C.

(57) ABSTRACT

The MEMS sensor according to the present invention includes a diaphragm. In the diaphragm, an angle formed by two straight lines connecting supporting portions and the center of a main portion with one another respectively is set to satisfy the relation of the following formula (1):

$$(A2/A1)/(B2/B1) \geq 1 \qquad (1)$$

A2: maximum vibrational amplitude of the diaphragm in a case of working a physical quantity of a prescribed value on the diaphragm A1: maximum vibrational amplitude of the diaphragm in a case of working the physical quantity on the diaphragm in an omitting structure obtained by omitting one of the supporting portions from the diaphragm B2: maximum stress caused in the diaphragm in the case of working the physical quantity on the diaphragm B1: maximum stress caused in the diaphragm in the case of working the physical quantity on the diaphragm in the omitting structure

8 Claims, 2 Drawing Sheets

U.S. PATENT DOCUMENTS

| | | |
|---|---|---|
| 7,880,367 B2 | 2/2011 | Nakatani |
| 7,919,006 B2 | 4/2011 | Park et al. |
| 7,923,790 B1 | 4/2011 | Quevy et al. |
| 7,972,887 B2 | 7/2011 | Shimooka |
| 7,994,594 B2 | 8/2011 | Inaba et al. |
| 8,003,422 B2 | 8/2011 | Lee et al. |
| 8,045,733 B2 * | 10/2011 | Zhe et al. .................. 381/174 |
| 2003/0042560 A1 | 3/2003 | Crenshaw et al. |
| 2004/0123664 A1 | 7/2004 | Ohtoyo et al. |
| 2004/0147056 A1 | 7/2004 | McKinnell et al. |
| 2005/0156260 A1 | 7/2005 | Partridge et al. |
| 2005/0218488 A1 | 10/2005 | Matsuo |
| 2005/0253283 A1 | 11/2005 | DCamp et al. |
| 2005/0260783 A1 | 11/2005 | Lutz et al. |
| 2006/0110854 A1 | 5/2006 | Horning et al. |
| 2006/0233401 A1 | 10/2006 | Wang |
| 2006/0267109 A1 | 11/2006 | Ohguro |
| 2007/0004096 A1 | 1/2007 | Heuvelman |
| 2007/0064968 A1 | 3/2007 | Weigold |
| 2007/0111365 A1 | 5/2007 | Tateishi et al. |
| 2007/0158826 A1 | 7/2007 | Sakakibara et al. |
| 2007/0190680 A1 | 8/2007 | Fukuda et al. |
| 2008/0135998 A1 | 6/2008 | Witvrouw et al. |
| 2008/0188025 A1 | 8/2008 | Nakamura |
| 2009/0045474 A1 | 2/2009 | Nakatani |
| 2009/0065928 A1 | 3/2009 | Lutz et al. |
| 2009/0111267 A1 | 4/2009 | Park et al. |
| 2009/0208037 A1 | 8/2009 | Zhe |
| 2009/0294879 A1 | 12/2009 | Bhagavat et al. |
| 2010/0090298 A1 | 4/2010 | Shih et al. |
| 2010/0155864 A1 | 6/2010 | Laming et al. |
| 2010/0171153 A1 | 7/2010 | Yang |
| 2010/0210073 A1 | 8/2010 | Witvrouw et al. |
| 2010/0213557 A1 | 8/2010 | Wang |
| 2011/0012212 A1 | 1/2011 | Nakatani et al. |
| 2011/0031566 A1 | 2/2011 | Kim et al. |
| 2011/0062532 A1 | 3/2011 | Wang |
| 2011/0104845 A1 | 5/2011 | Nakatani |
| 2011/0108933 A1 | 5/2011 | Nakatani |
| 2011/0127624 A1 | 6/2011 | Nakatani |
| 2011/0140213 A1 | 6/2011 | Kasia et al. |
| 2011/0165718 A1 | 7/2011 | Lutz et al. |
| 2011/0169110 A1 | 7/2011 | Shih et al. |
| 2011/0183455 A1 | 7/2011 | Wang |
| 2011/0186945 A1 | 8/2011 | Shih et al. |
| 2011/0221013 A1 | 9/2011 | Partridge et al. |
| 2011/0227176 A1 | 9/2011 | Wang |

FOREIGN PATENT DOCUMENTS

| | | |
|---|---|---|
| JP | 2001-518246 | 10/2001 |
| JP | 2002-530844 | 9/2002 |
| JP | 2002-328117 | 11/2002 |
| JP | 2004-198280 | 7/2004 |
| JP | 2007-152546 | 6/2007 |
| JP | 2007-180201 | 7/2007 |
| JP | 2008-85507 | 4/2008 |
| WO | WO 98/37388 | 8/1998 |
| WO | WO 00/29640 | 5/2000 |

* cited by examiner

MEMS SENSOR

This is a Continuation of U.S. application Ser. No. 12/485,696, filed Jun. 16, 2009, now the U.S. Pat. No. 8,039,911, the subject matter of which is incorporated herein by reference.

BACKGROUND OF THE INVENTION

1. Field of the Invention

The present invention relates to various sensors (MEMS sensors) manufactured by an MEMS (Micro Electro Mechanical Systems) technique.

2. Description of Related Art

An MEMS sensor, having been recently loaded on a portable telephone or the like, is watched with interest. For example, a silicon microphone (an Si microphone) is a typical MEMS sensor.

The silicon microphone includes a silicon substrate. A through-hole passing through the silicon substrate in the thickness direction is formed in the central portion of the silicon substrate. A diaphragm made of polysilicon is provided on the silicon substrate to be opposed to the through-hole. The diaphragm integrally has a main portion and a single supporting portion supporting the main portion. The main portion is generally circular in plan view. The supporting portion is in the form of an arm extending sideward from the peripheral edge of the main portion, and the forward end portion thereof is fixed to the silicon substrate. Thus, the diaphragm is vibratile in a direction opposed to the surface of the silicon substrate in such a one-point support state that the main portion is supported by the single supporting portion. A back plate is arranged on a side of the diaphragm opposite to the substrate at a small interval from the diaphragm. The diaphragm and the back plate form a capacitor having the diaphragm and the back plate as counter electrodes.

When the diaphragm vibrates due to a sound pressure (sound wave) while a prescribed voltage is applied to the capacitor (between the diaphragm and the back plate), the capacitance of the capacitor changes, and voltage fluctuation between the diaphragm and the back plate resulting from the change of the capacitance is output as a sound signal.

The sensitivity of the silicon microphone is improved as the vibrational amplitude (displacement in a direction orthogonal to a sound pressure input surface) of the diaphragm with respect to the same sound pressure is increased. If the diaphragm remarkably vibrates and excessive stress is caused in the diaphragm, however, the diaphragm is broken due to the stress.

The vibrational amplitude (vibratility) of the diaphragm with respect to the same sound pressure can be reduced by increasing the number of supporting portions, for example. Depending on the arrangement of a plurality of supporting portions, however, the vibrational amplitude of the diaphragm with respect to the same sound pressure is extremely reduced to remarkably lower the sensitivity of the silicon microphone. When the diaphragm is supported by a plurality of supporting portions, therefore, the supporting portions must be arranged with due consideration.

SUMMARY OF THE INVENTION

Accordingly, an object of the present invention is to provide an MEMS sensor having a plurality of supporting portions arranged on proper positions.

An MEMS sensor according to an aspect of the present invention includes a substrate and a diaphragm provided on the substrate for vibrating due to the action of a physical quantity. The diaphragm integrally has a main portion arranged on the substrate in a floating state and supporting portions extending in a direction along the surface of the substrate from two positions in the peripheral edge of the main portion. An angle formed by two straight lines connecting the supporting portions and the center of the main portion with one another respectively is set to satisfy the relation of the following formula (1):

$$(A2/A1)/(B2/B1) \geq 1 \quad (1)$$

A2: maximum vibrational amplitude of the diaphragm in a case of working a physical quantity of a prescribed value on the diaphragm A1: maximum vibrational amplitude of the diaphragm in a case of working the physical quantity of the prescribed value on the diaphragm in a structure obtained by omitting one of the supporting portions from the diaphragm B2: maximum stress caused in the diaphragm in the case of working the physical quantity of the prescribed value on the diaphragm B1: maximum stress caused in the diaphragm in the case of working the physical quantity of the prescribed value on the diaphragm in the structure obtained by omitting one of the supporting portions from the diaphragm Acceleration or a sound pressure can be illustrated as the physical quantity.

According to the structure, the diaphragm vibrating due to the action of the physical quantity is provided on the substrate. The diaphragm integrally has the main portion and the two supporting portions. The main portion is supported by the two supporting portions, and arranged on the substrate in the floating state. The two supporting portions extend in the direction along the surface of the substrate from different portions of the peripheral edge of the main portion respectively.

When the main portion is supported by the two supporting portions, the maximum vibrational amplitude A2 of the diaphragm in the case where the physical quantity of the prescribed value acts on the diaphragm and the maximum stress B2 caused in the diaphragm at this time depend on the arrangement of the two supporting portions. The maximum vibrational amplitude A2 is smaller than the maximum vibrational amplitude A1 of the diaphragm in the case where the physical quantity of the prescribed value acts on the diaphragm having the structure supporting the main portion with one supporting portion. Further, the maximum stress B2 is smaller than the maximum stress B1 caused in the diaphragm in the case where the physical quantity of the prescribed value acts on the diaphragm having the structure supporting the main portion with one supporting portion. The diaphragm is hardly broken by stress as the maximum stress B2 is reduced.

If the two supporting portions are so arranged that the reduction ratio of the maximum vibrational amplitude A2 with respect to the maximum vibrational amplitude A1 exceeds the reduction ratio of the maximum stress B2 with respect to the maximum stress B1, however, the sensitivity of the MEMS sensor (vibratility of the diaphragm) is disadvantageously reduced despite the advantage of preventing breakage of the diaphragm attained by stress reduction.

Therefore, the angle formed by the two straight lines connecting the supporting portions and the center of the main portion with one another respectively is set to satisfy the relation (A2/A1)/(B2/B1)≧1. Thus, the two supporting portions are arranged on proper positions, and the reduction ratio of the maximum vibrational amplitude A2 with respect to the maximum vibrational amplitude A1 does not exceed the reduction ratio of the maximum stress B2 with respect to the maximum stress B1. Consequently, remarkable reduction of the sensitivity of the MEMS sensor can be prevented while breakage of the diaphragm resulting from stress can be suppressed.

An MEMS sensor according to another aspect of the present invention includes a substrate and a diaphragm provided on the substrate for vibrating due to the action of a physical quantity. The diaphragm integrally has a main portion arranged on the substrate in a floating state and supporting portions extending in a direction along the surface of the substrate from not less than three positions in the peripheral edge of the main portion. Not less than three supporting portions are arranged to satisfy the relation of the following formula (2):

$$(Ap/A1)/(Bp/B1) \geq 1 \qquad (2)$$

Ap: maximum vibrational amplitude of the diaphragm in a case of working a physical quantity of a prescribed value on the diaphragm A1: maximum vibrational amplitude of the diaphragm in a case of working the physical quantity of the prescribed value on the diaphragm in a structure obtained by omitting the remaining supporting portions other than one of the supporting portions from the diaphragm Bp: maximum stress caused in the diaphragm in the case of working the physical quantity of the prescribed value on the diaphragm B1: maximum stress caused in the diaphragm in the case of working the physical quantity of the prescribed value on the diaphragm in the structure obtained by omitting the remaining supporting portions other than one of the supporting portions from the diaphragm According to the structure, the diaphragm vibrating due to the action of the physical quantity is provided on the substrate. The diaphragm integrally has the main portion and not less than three supporting portions. The main portion is supported by not less than three supporting portions, and arranged on the substrate in the floating state. Not less than three supporting portions extend in the direction along the surface of the substrate from different portions of the peripheral edge of the main portion respectively. Not less than three supporting portions are arranged to satisfy the relation $(Ap/A1)/(Bp/B1) \geq 1$. Thus, not less than three supporting portions are arranged on proper positions, and the reduction ratio of the maximum vibrational amplitude Ap with respect to the maximum vibrational amplitude A1 does not exceed the reduction ratio of the maximum stress Bp with respect to the maximum stress B1. Consequently, remarkable reduction of the sensitivity of the MEMS sensor can be prevented while breakage of the diaphragm resulting from stress can be suppressed.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
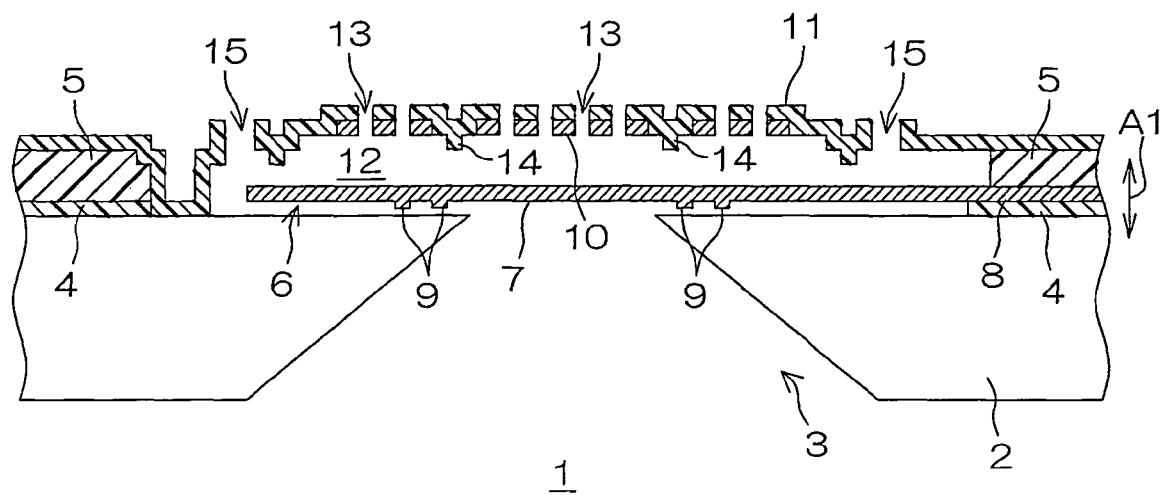
FIG. 1 is a schematic sectional view of a silicon microphone according to an embodiment of the present invention.

FIG. 1 is a schematic sectional view of a silicon microphone according to an embodiment of the present invention.

A silicon microphone 1 is a sensor (an MEMS sensor) manufactured by the MEMS technique. The silicon microphone 1 includes a substrate 2 made of silicon. A through-hole 3 having a trapezoidal sectional shape narrowed toward the surface (widened toward the rear surface) is formed in the central portion of the substrate 2.

A first insulating film 4 is stacked on the substrate 2. The first insulating film 4 is made of silicon oxide, for example.

A second insulating film 5 is stacked on the first insulating film 4. The second insulating film 5 is made of PSG (Phospho Silicate Glass), for example.

Portions of the first insulating film 4 and the second insulating film 5 located on the through-hole 3 and a portion (hereinafter referred to as a "through-hole peripheral portion") of the surface (the upper surface) of the substrate 2 around the through-hole 3. Thus, the through-hole peripheral portion is exposed from the first insulating film 4 and the second insulating film 5.

A diaphragm 6 is provided above the substrate 2. The diaphragm 6 is made of polysilicon doped with an impurity to be provided with conductivity, for example. The diaphragm 6 integrally has a main portion 7 and two supporting portions 8.

The main portion 7 is circular in plan view, opposed to the through-hole 3 and the through-hole peripheral portion, and arranged in a state floating above the through-hole peripheral portion. A plurality of protruding lower stoppers 9 for preventing the main portion 7 and the through-hole peripheral portion from adhesion are formed on the lower surface (the surface opposed to the through-hole peripheral portion) of the main portion 7.

The two supporting portions 8 extend in a direction (a sideward direction) along the surface of the substrate 2 from two positions on the peripheral edge of the main portion 7 respectively. The forward end portion of each supporting portion 8 enters the space between the first insulating film 4 and the second insulating film 5, so that the supporting portion 8 is cantilever-supported by the first insulating film 4 and the second insulating film 5. The two supporting portions 8 support the main portion 7, whereby the diaphragm 6 is enabled to vibrate in a direction A1 opposed to the surface of the substrate 2 in a two-point support state.

A back plate 10 is provided above the diaphragm 6. The back plate 10 has a circular outer shape smaller in diameter than the main portion 7 of the diaphragm 6 in plan view, and is opposed to the main portion 7 through a gap. The back plate 10 is made of polysilicon doped with an impurity to be provided with conductivity, for example.

The outermost surface of the silicon microphone 1 is covered with a third insulating film 11. The third insulating film 11 is formed to cover the upper surfaces of the first insulating film 4 and the back plate 10 and to surround the side portion of the diaphragm 6 at an interval from the peripheral edge of the diaphragm 6. Thus, a space 12 partitioned by the third insulating film 11 is formed on the substrate 2, and the main portion 7 of the diaphragm 6 is arranged in the space 12 in a state not in contact with the substrate 2 and the third insulating film 11.

A large number of small holes 13 are formed in the back plate 10 and the third insulating film 11 to continuously pass through the same. The third insulating film 11 enters partial holes 13, and protruding upper stoppers 14 protruding downward beyond the lower surface (the surface opposed to the diaphragm 6) of the back plate 10 are formed on the portions of the third insulating film 11 entering the holes 13. The upper stoppers 14 are so formed that the diaphragm 6 is prevented from coming into contact with the back plate 10 upon vibration of the diaphragm 6.

A plurality of communication holes 15 are formed in the third insulating film 11 around the back plate 10 in a circularly aligned manner.

The diaphragm 6 and the back plate 10 form a capacitor having the diaphragm 6 and the back plate 10 as counter electrodes. A prescribed voltage is applied to the capacitor (between the diaphragm 6 and the back plate 10). When the diaphragm 6 vibrates due to a sound pressure (sound wave) in this state, the capacitance of the capacitor changes, and voltage fluctuation between the diaphragm 6 and the back plate 10 resulting from the change of the capacitance is extracted (output) as a sound signal.

Figure 2:
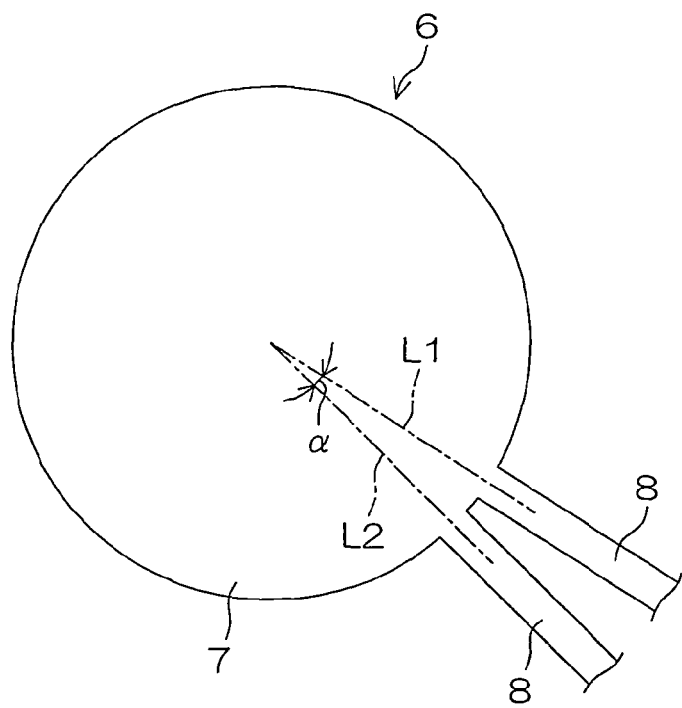
FIG. 2 is a schematic plan view of a diaphragm shown in FIG. 1.

FIG. 2 is a schematic plan view of the diaphragm 6.

The two supporting portions 8 of the diaphragm 6 are arranged on two positions separated by an angle α from each other around the center of the main portion 7 respectively. In other words, the two supporting portions 8 are so arranged that a straight line L1 connecting one of the supporting portions 8 and the center of the main portion 7 with each other and a straight line L2 connecting the other supporting portion 8 and the center of the main portion 7 with each other form the angle α.

The angle α is set to satisfy the following formula (1):

$$(A2/A1)/(B2/B1) \geq 1 \quad (1)$$

A2: maximum vibrational amplitude of the diaphragm 6 in a case of inputting a prescribed sound pressure in the diaphragm 6

A1: maximum vibrational amplitude of a diaphragm having a main portion 7 supported by one supporting portion 8 in a case of inputting the prescribed sound pressure in the diaphragm B2: maximum stress caused in the diaphragm 6 in the case of inputting the prescribed sound pressure in the diaphragm 6

B1: maximum stress caused in the diaphragm having the main portion 7 supported by one supporting portion 8 in the case of inputting the prescribed sound pressure in the diaphragm <Simulation>

The inventor of the present invention has conducted a simulation for examining the relation between the angle α, the maximum vibrational amplitude of the diaphragm 6 and the maximum stress caused in the diaphragm 6.

In the simulation, "IntelliSuite (registered trademark)" by IntelliSense Corporation was employed as a simulator. A diaphragm (i.e., the diaphragm 6) having such a structure (a two-point support structure) that a main portion 7 is supported by two supporting portions 8 and a diaphragm having such a structure (a one-point support structure) that a main portion 7 is supported by a supporting portion 8 were assumed. The material for each diaphragm is polysilicon deposited by LPCVD (Low Pressure Chemical Vapor Deposition). Each main portion 7 is 600 μm in diameter by 1 μm in thickness. Each supporting portion 8 is 30 μm by 100 μm by 1 μm in size. The following values were input in the simulator as the physical properties of each diaphragm:

Density: 2.3 [g/cm$^3$]
Thermal expansion coefficient: 20 [10E-7/° C.]
Resistivity: 1 [Ω·cm]
Thermal conductivity: 1.5 [W/cm/° C.]
Specific heat: 0.71 [J/g/° C.]
Young's modulus: 160 [GPa]
Poisson's ratio: 0.226
Dielectric constant: 1

1 Pa was input in the main portion 7 of the diaphragm having the one-point support structure, to check the maximum vibrational amplitude A1 of the diaphragm and the maximum stress B1 caused in the diaphragm. In the diaphragm 6 having the two-point support structure, the angle α shown in FIG. 2 was set to 7.5°, 10°, 12.5°, 15°, 20°, 30°, 40°, 45°, 50°, 60°, 75°, 90°, 105°, 120°, 135°, 150°, 165° and 180° and 1 Pa was input in the main portion 7 every angle, to check the maximum vibrational amplitude A2 of the diaphragm 6 and the maximum stress B2 caused in the diaphragm 6. Further, the ratio (A2/A1) of the maximum vibrational amplitude A2 to the maximum vibrational amplitude A1 and the ratio (B2/B1) of the maximum stress B2 to the maximum stress B1 were obtained, to obtain the value of the left side (A2/A1)/(B2/B1) of the formula (1).

Table 1 shows the results of the simulation.

TABLE 1

| Angle α | Maximum Vibrational Amplitude | | Maximum Stress | | (A2/A1)/(B2/B1) |
|---|---|---|---|---|---|
| | A2 [μm] | Percent Ratio to One-Point Support | B2 [Mpa] | Percent Ratio to One-Point Support | |
| 7.5 | 10.63 | 54.5 | 12.97 | 49.8 | 1.09 |
| 10 | 10.45 | 53.6 | 12.92 | 49.6 | 1.08 |
| 12.5 | 10.3 | 52.8 | 12.85 | 49.3 | 1.07 |
| 15 | 10.17 | 52.1 | 12.76 | 49.0 | 1.06 |
| 20 | 9.92 | 50.8 | 12.69 | 48.7 | 1.04 |
| 30 | 9.35 | 47.9 | 13.14 | 50.4 | 0.95 |
| 40 | 8.69 | 44.5 | 13.27 | 50.9 | 0.87 |
| 45 | 8.33 | 42.7 | 13.23 | 50.8 | 0.84 |
| 50 | 7.96 | 40.8 | 13.11 | 50.3 | 0.81 |
| 60 | 7.18 | 36.8 | 12.72 | 48.8 | 0.75 |
| 75 | 5.98 | 30.7 | 11.77 | 45.2 | 0.68 |
| 90 | 4.83 | 24.8 | 10.54 | 40.5 | 0.61 |
| 105 | 3.77 | 19.3 | 9.15 | 35.1 | 0.55 |
| 120 | 2.82 | 14.5 | 7.7 | 29.6 | 0.49 |
| 135 | 2.01 | 10.3 | 6.27 | 24.1 | 0.43 |
| 150 | 1.32 | 6.8 | 4.89 | 18.8 | 0.36 |
| 165 | 0.76 | 3.9 | 3.57 | 13.7 | 0.28 |
| 180 | 0.31 | 1.6 | 2.62 | 10.1 | 0.16 |
| One-Point Support | A1 = 19.51 | — | B1 = 26.05 | — | — |

As understood from the results of the simulation, the maximum vibrational amplitude A2 and the maximum stress B2 depend on the arrangement of the two supporting portions 8 in the diaphragm 6. The maximum vibrational amplitude A2 is smaller than the maximum vibrational amplitude A1. Further, the maximum stress B2 is smaller than the maximum stress B1. The diaphragm 6 is hardly broken by stress as the maximum stress B2 is reduced. If the two supporting portions 8 are so arranged that the reduction ratio of the maximum vibrational amplitude A2 with respect to the maximum vibrational amplitude A1 exceeds the reduction ratio of the maximum stress B2 with respect to the maximum stress B1, however, the sensitivity of the silicon microphone 1 (vibratility of the diaphragm 6) is disadvantageously reduced despite the advantage of preventing breakage of the diaphragm 6 attained by stress reduction.

Therefore, the angle α formed by the two straight lines L1 and L2 shown in FIG. 2 is set to satisfy the relation (A2/A1)/(B2/B1) ≥ 1. In a model set in the simulation, for example, the angle α is set in the range of about 7.5° to 20° from the results of the simulation. Thus, the two supporting portions 8 are arranged on proper positions, and the reduction ratio of the maximum vibrational amplitude A2 with respect to the maximum vibrational amplitude A1 does not exceed the reduction ratio of the maximum stress B2 with respect to the maximum stress B1. Consequently, remarkable reduction of the sensitivity of the silicon microphone 1 can be prevented while breakage of the diaphragm 6 resulting from stress can be suppressed.

Figure 3:
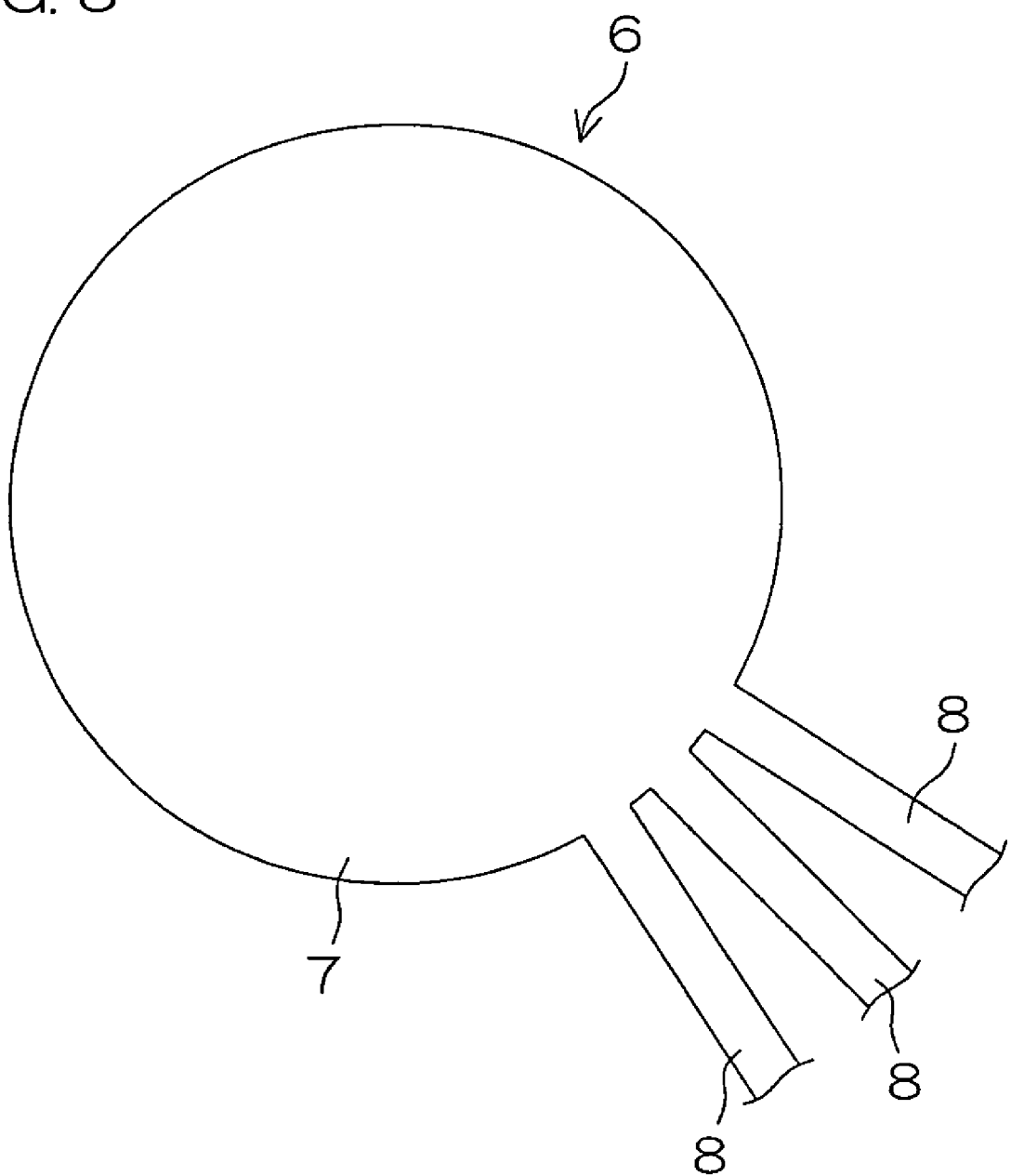
FIG. 3 is a schematic plan view of a silicon microphone according to another embodiment of the present invention.

While the main portion 7 is supported by the two supporting portions 8 in the aforementioned structure, the main portion 7 may alternatively be supported by not less than three supporting portions 8, as shown in FIG. 3. In this case, not less than three supporting portions 8 are arranged to satisfy the relation of the following formula (2):

$$(Ap/A1)/(Bp/B1) \geqq 1 \quad (2)$$

Ap: maximum vibrational amplitude of a diaphragm having not less than three supporting portions 8 in a case of inputting a prescribed sound pressure in the diaphragm A1: maximum vibrational amplitude of the diaphragm having the main portion 7 supported by one supporting portion 8 in a case of inputting the prescribed sound pressure in the diaphragm Bp: maximum stress caused in the diaphragm having not less than three supporting portions 8 in the case of inputting the prescribed sound pressure in the diaphragm B1: maximum stress caused in the diaphragm having the main portion 7 supported by one supporting portion 8 in the case of inputting the prescribed sound pressure in the diaphragm.

Thus, not less than three supporting portions 8 are arranged on proper positions and the reduction ratio of the maximum vibrational amplitude Ap with respect to the maximum vibrational amplitude A1 does not exceed the reduction ratio of the maximum stress Bp with respect to the maximum stress B1, similarly to the structure (the structure according to the aforementioned embodiment) having the main portion 7 supported by the two supporting portions 8. Consequently, remarkable reduction of the sensitivity of the silicon microphone 1 can be prevented while breakage of the diaphragm 6 resulting from stress can be suppressed.

While the silicon microphone has been employed as an example of the MEMS sensor, the present invention is not restricted to the silicon microphone, but applicable to an acceleration sensor for detecting acceleration of a substance or a gyro sensor for detecting angular velocity of a substance.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-156937 filed with the Japan Patent Office on Jun. 16, 2008, the disclosure of which is incorporated herein by reference.

What is claimed is:

1. An MEMS sensor, comprising:
    a substrate; and
    a diaphragm made of polysilicon, the diaphragm being provided on the substrate and vibrating due to an action of a physical quantity, the diaphragm integrally having:
        a main portion arranged on the substrate in a floating state, and
        supporting portions extending in a direction along a surface of the substrate from two positions in a peripheral edge of the main portion, the supporting portions having a length not less than three times larger than a width thereof, an angle formed by two straight lines connecting the supporting portions and a center of the main portion with one another respectively being from 7.5° to 20°.

2. The MEMS sensor according to claim 1, further comprising a first insulating film and a second insulating film stacked on the substrate in this order, wherein
    a forward end portion of each supporting portion enters a space between the first insulating film and the second insulating film, so that the supporting portion is cantilever-supported by the first insulating film and the second insulating film.

3. The MEMS sensor according to claim 1, further comprising a back plate opposed to the main portion through a gap on a side opposite to the substrate.

4. The MEMS sensor according to claim 3, further comprising a plurality of protruding upper stoppers protruding from the surface of the back plate opposed to the main portion toward the main portion for preventing contact between the main portion and the back plate, wherein
    the plurality of protruding upper stoppers include a peripheral stopper opposed to the peripheral edge of the main portion and a center stopper opposed to a center portion of the main portion surrounded by the peripheral edge.

5. The MEMS sensor according to claim 4, wherein
    a height of the peripheral stopper measured from the surface of the back plate is larger than a height of the center stopper measured in the same way.

6. The MEMS sensor according to claim 3, further comprising a plurality of protruding upper stoppers protruding from the surface of the back. plate opposed to the main portion toward the main portion for preventing contact between the main portion and the back plate, wherein
    the plurality of protruding upper stoppers have different heights measured from the surface of the back plate.

7. The MEMS sensor according to claim 3, wherein
    a through-hole is formed in the substrate, and
    the MEMS sensor further comprises a plurality of protruding upper stoppers protruding from the surface of the back plate opposed to the main portion toward the main portion for preventing contact between the main portion and the back plate, and the plurality of protruding upper stoppers opposed to a peripheral portion of the through-hole.

8. The MEMS sensor according to claim 1, wherein
    a plurality of protruding lower stoppers for preventing the main portion and the substrate from adhesion are formed on a surface of the main portion opposed to the substrate.

* * * * *